US009625810B2

(12) United States Patent
Wang et al.

(10) Patent No.: US 9,625,810 B2
(45) Date of Patent: Apr. 18, 2017

(54) SOURCE MULTIPLEXING ILLUMINATION FOR MASK INSPECTION

(75) Inventors: Daimian Wang, Fremont, CA (US); Daniel Wack, Fredericksburg, VA (US); Damon F. Kvamme, Los Gatos, CA (US); Tao-Yi Fu, Fremont, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 1063 days.

(21) Appl. No.: 13/419,157

(22) Filed: Mar. 13, 2012

(65) Prior Publication Data

US 2012/0236281 A1    Sep. 20, 2012

Related U.S. Application Data

(60) Provisional application No. 61/453,491, filed on Mar. 16, 2011.

(51) Int. Cl.
*G02B 5/08*  (2006.01)
*G02B 7/182* (2006.01)
*G03F 1/84*  (2012.01)

(52) U.S. Cl.
CPC .................................... *G03F 1/84* (2013.01)

(58) Field of Classification Search
CPC ........ G03F 7/7005; G03F 1/84; G03F 7/7065; G03F 1/24; G03F 7/70275; G03F 7/70025; G03F 7/70091
USPC .... 359/849–865, 204.1–204.4, 226.1, 201.2; 250/504 R, 365, 372, 492.2, 492.1, 493.1, 250/494.1; 355/119, 120, 52, 53, 55, 355/67–71; 353/37, 99; 356/39, 338
See application file for complete search history.

(56) References Cited

U.S. PATENT DOCUMENTS

| 4,729,071 A | * | 3/1988 | Solomon ................. F21V 21/30 359/212.2 |
| 6,396,068 B1 |   | 5/2002 | Sweatt et al. |
| 6,693,926 B2 |   | 2/2004 | Cayrefourcq et al. |
| 6,861,656 B2 |   | 3/2005 | Murakami |
| 7,002,164 B2 | * | 2/2006 | Goldstein ............. G03F 7/7005 250/492.1 |
| 7,183,565 B2 |   | 2/2007 | Goldstein et al. |
| 7,221,453 B2 | * | 5/2007 | Sharpe ............... G01N 15/1436 356/338 |
| 7,482,609 B2 |   | 1/2009 | Ershov et al. |
| 7,636,149 B2 | * | 12/2009 | Suzuki .................. B82Y 10/00 355/53 |

(Continued)

*Primary Examiner* — Scott J Sugarman
*Assistant Examiner* — Mustak Choudhury
(74) *Attorney, Agent, or Firm* — Suiter Swantz pc llo

(57) ABSTRACT

Methods and systems for source multiplexing illumination for mask inspection are disclosed. Such illumination systems enable EUV sources of small brightness to be used for EUV mask defect inspection at nodes below the 22 nm. Utilizing the multiple plane or conic mirrors that are either attached to a continuously rotating base with different angles or individually rotating to position for each pulse, the reflected beams may be directed through a common optical path. The light may then be focused by a condenser to an EUV mask. The reflected and scattered light from the mask may then be imaged by some imaging optics onto some sensors. The mask image may be subsequently processed for defect information.

17 Claims, 9 Drawing Sheets

(56) References Cited

U.S. PATENT DOCUMENTS

| | | | |
|---|---|---|---|
| 7,978,822 B2 * | 7/2011 | Windt | A61B 6/4021 |
| | | | 359/850 |
| 2004/0155207 A1 | 8/2004 | Kleinschmidt | |
| 2006/0091327 A1 | 5/2006 | Kroon | |
| 2007/0041004 A1 * | 2/2007 | Suzuki | B82Y 10/00 |
| | | | 355/67 |
| 2007/0181834 A1 * | 8/2007 | Kleinschmidt | 250/504 R |

* cited by examiner

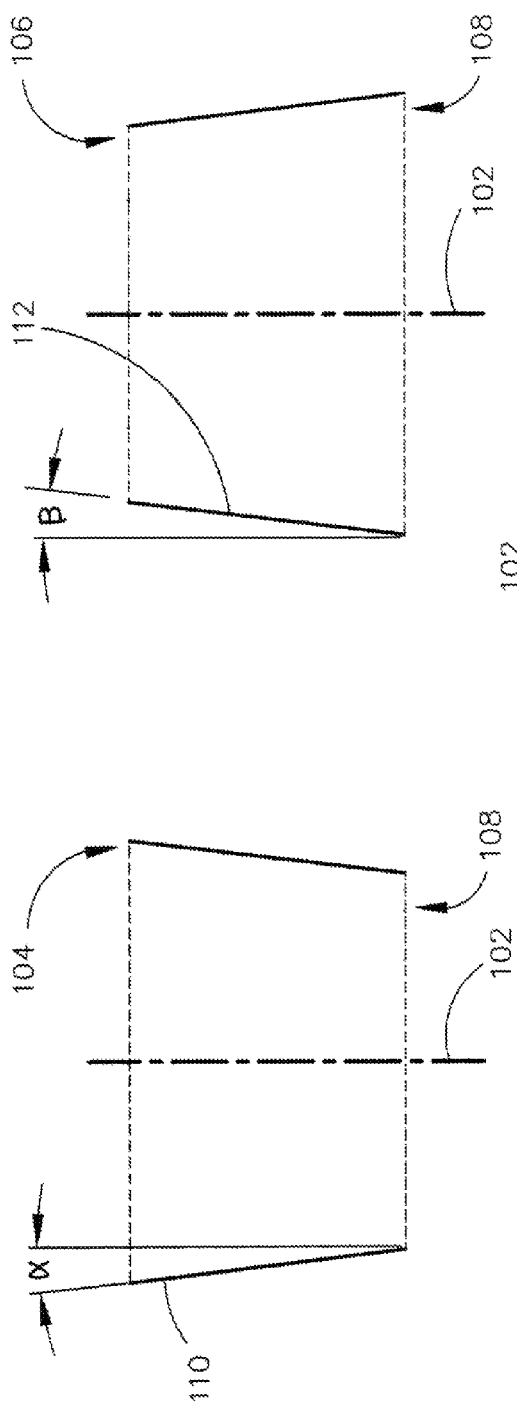
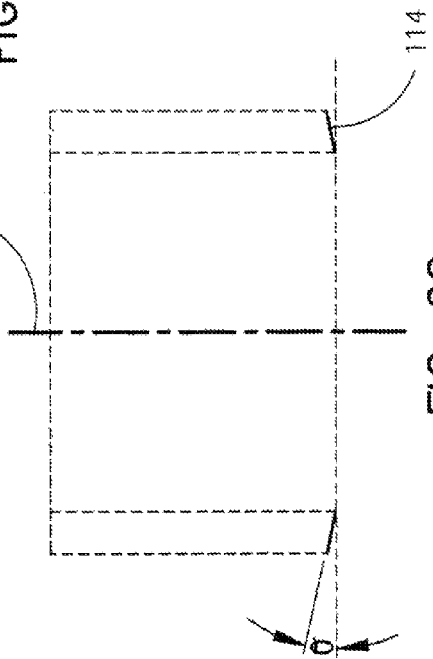

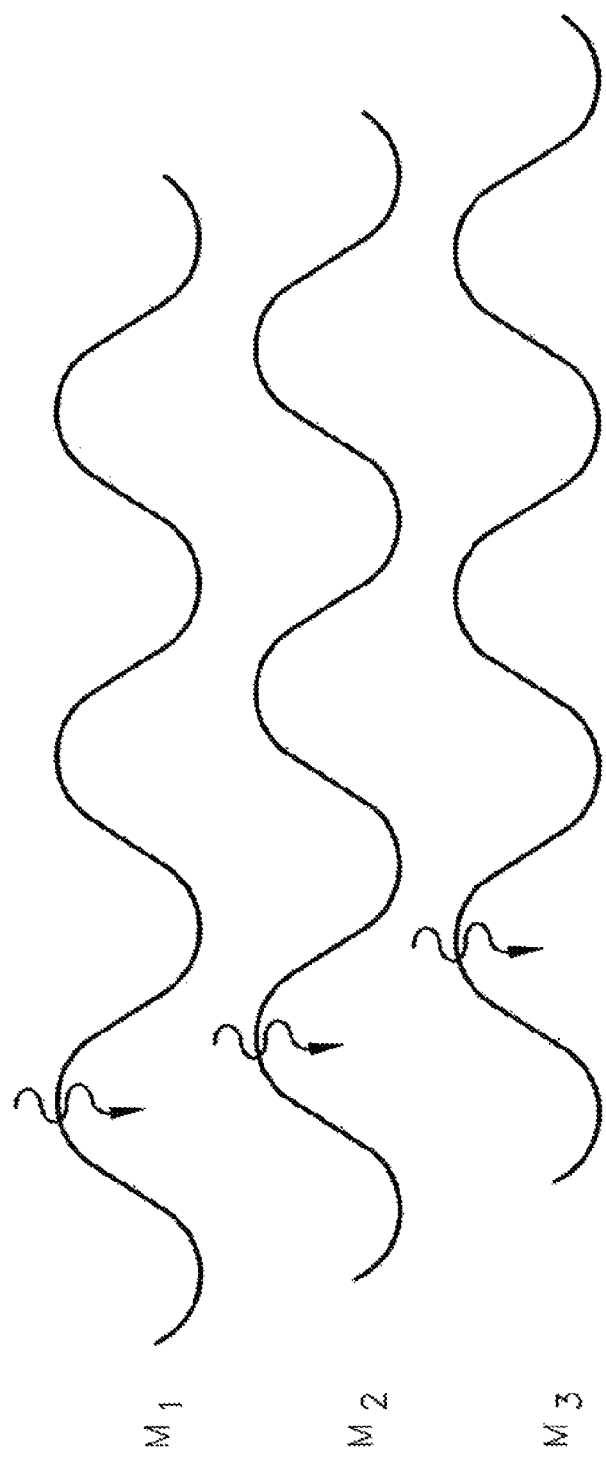

SOURCE MULTIPLEXING ILLUMINATION FOR MASK INSPECTION

CROSS-REFERENCE TO RELATED APPLICATIONS

The present application claims the benefit under 35 U.S.C. §119(e) of U.S. Provisional Application Ser. No. 61/453,491, filed Mar. 16, 2011. Said U.S. Provisional Application Ser. No. 61/453,491 is hereby incorporated by reference in its entirety.

TECHNICAL FIELD

The disclosure generally relates to the field of mask inspection, and particularly to methods and systems for providing source multiplexing illumination for mask inspection.

BACKGROUND

Mask inspection, or photo mask inspection, is an operation of checking the correctness of the fabricated photo masks (e.g., used for semiconductor device fabrications). Modern technologies for locating defects in photo masks are automated systems that involve scanning electron microscopy and other advanced tools. Existing illumination systems in the market for mask inspection employ ultra-violet light at or above 193 nm that are not sufficient to resolve the features and defects below the 22 nm node. In order to resolve features and defects below 22 nm node, light of shorter wavelength in the EUV (e.g., 13.5 nm) region needs to be used. Since the brightness of commercially available EUV source is not sufficient, multiple sources are required. Some illumination techniques have been disclosed in an attempt to support multiple sources.

One such technique is disclosed in U.S. Pat. No. 6,396,068, which uses a two-stage method to increase the number of source units that can be temporally multiplexed. According to this technique, multiple sources are placed on translational stages that select different sources at different time. Then a rotational stage acts as a beam combiner that selects beams from several sources selected in the first stage. However, it is noted that this technique can only multiplex a few source units within a limited track length (e.g., 2-3 m from a commercially available EUV source to mask) and small range of normal or grazing incident angles where mirror reflectivity is high (R>60% for 0-20° normal incidence, and R>80% for 0-15° grazing incidence). Furthermore, the reflected optical path changes its direction due to the duration of each pulse, the sources time jitter (pulses are emitted at different time than expected), and the velocity instability of rotatable or translational base.

Another technique is disclosed in U.S. Pat. No. 6,861,656, which selectively tilts a planar mirror angle in coordinates with a selective activation of EUV source units. However, it is noted that this technique also can only multiplex a few source units within a limited track length and small range of normal or grazing incident angles where mirror reflectivity is high. Furthermore, the reflected optical path also changes its direction due to the duration of each pulse, the sources time jitter, and the velocity instability of rotatable or translational base.

Still another technique is disclosed in U.S. Pat. No. 7,183,565, which uses a rotatable base to reflect EUV beams from multiple sources. The rotatable base comprises multiple mirrors mounted at various angles and displaced radially from the axis of rotation. The mirrors are positioned to reflect light in the near normal incident direction. However, it is noted that this technique also has the same shortcomings as the other techniques described above.

A further technique is disclosed in U.S. patent application Ser. No. 11/622,241, which uses a reflecting optical element that is mounted to a step or servo rotatable motor to reflect multiple EUV sources to a common optical path for use in semiconductor lithography. It is noted that this technique is only suitable for lithography usage where the dwell time is about 24%, whereas mask inspection requires 100% dwell time. Furthermore, this technique also can only multiplex a few source units within a limited track length and small range of normal or grazing incident angles where mirror reflectivity is high.

Therein lies a need for a method and apparatus for delivering EUV photons from multiple sources to an EUV photo mask for mask inspection, without the aforementioned shortcomings.

SUMMARY

The present disclosure is directed to an illumination system. The illumination system may include a base member rotatable about a rotation axis. The base member defines at least an outer surface, an inner surface and an end surface. A first set of mirrors may be mounted to the outer surface of the base member, a second set of mirrors may be mounted to the inner surface of the base member, and a third set of mirrors may be mounted to the end surface of the base member. The mirror surfaces of the first set of mirrors may be faced away from the rotation axis and tilted away from the rotation axis by a first predetermined angle. The mirror surfaces of the second set of mirrors may be faced toward the rotation axis and tilted toward the rotation axis by a second predetermined angle. The mirror surfaces of the third set of mirrors may be tilted by a third predetermined angle with respect to an axis perpendicular to the rotation axis. The first set of mirrors, the second set of mirrors and the third set of mirrors are configured for reflecting radiations from a plurality of illumination sources to a common optical path.

A further embodiment of the present disclosure is also directed to an illumination system. The illumination system may include at least one illumination source, a base member rotatable about a rotation axis, and a conic mirror positioned on the base member. The center of axis of the conic mirror may coincide with the rotation axis, wherein the conic mirror is configured for receiving light from the at least one illumination source at grazing incidence and reflecting the light to an optical path.

An additional embodiment of the present disclosure is also directed to an illumination system. The illumination system may include an array of mirrors placed along a common optical axis, at least one light source corresponding to each particular mirror of the array of mirrors, and a control mechanism in communication with the array of mirrors. The control mechanism may be configured for positioning each particular mirror of the array of mirrors in a reflecting position when the at least one light source corresponding to the particular mirror emits a pulse of light.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure.

Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which:

FIG. 2A is a cross-sectional view of the rotatable base member of FIG. 1, depicting the mirrors mounted to the outer surface of the rotatable base member;

FIG. 2B is another cross-sectional view of the rotatable base member of FIG. 1, depicting the mirrors mounted to the inner surface of the rotatable base member;

FIG. 2C is another cross-sectional view of the rotatable base member of FIG. 1, depicting the mirrors mounted to the end surface of the rotatable base member;

FIG. 13 is still another timing diagram depicting the timing of an array of mirrors duration operation.

DETAILED DESCRIPTION

Figure 1A:
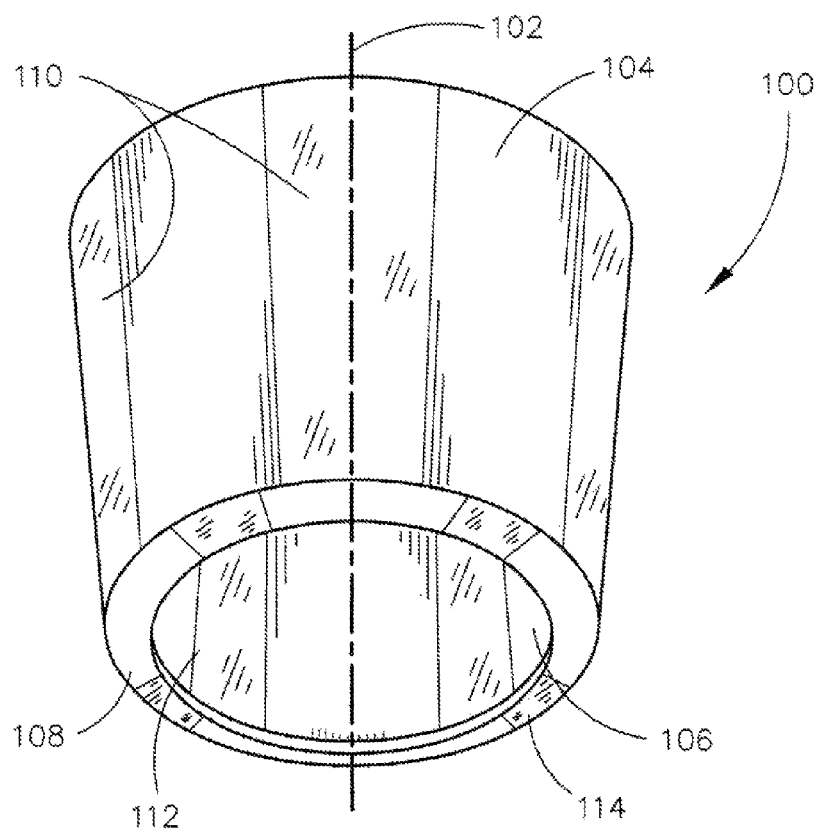
FIG. 1A is an isometric view of a rotatable base member of an illumination system according to an embodiment of the present invention.

Reference will now be made in detail to the subject matter disclosed, which is illustrated in the accompanying drawings.

The present disclosure is directed to methods and systems for delivering extreme ultraviolet (EUV) photons from multiple sources to an EUV photo mask for mask inspection. Existing EUV sources cannot provide enough brightness cost effectively for mask inspection. A few types of discharge produced plasma (DPP) sources have brightness in the range of 3-10 W/mm$^2$sr, which is not enough to satisfy the brightness requirements of 30-200 W/mm$^2$sr. Other types of laser produced plasma (LPP) sources that are designed for lithography may provide enough brightness, but are very expensive and also require significant modification for mask inspection purposes. In accordance with the present disclosure, multiple pulsed EUV sources are temporally multiplexed to increase the total source brightness. This is required for EUV mask inspection down to the 11 nm node roadmap.

Referring to FIGS. 1 through 5, one embodiment of the illumination system in accordance to the present disclosure is shown. The illumination system may include a rotatable base member 100 rotatable about a rotation axis 102. The base member 100 may provide at least three different surfaces where mirrors may be mounted to. For instance, the base member 100 may provide an outer surface 104, an inner surface 106 and an end surface 108. In this manner, EUV beams from different directions can be reflected by the mirrors to a common optical path.

Figure 3:
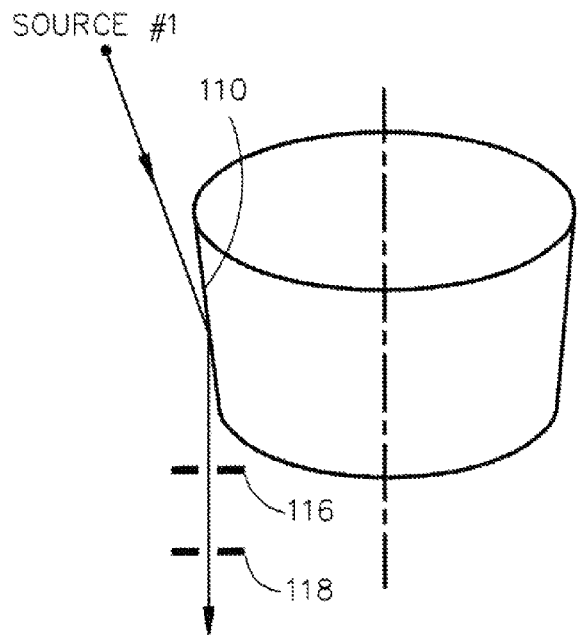
FIG. 3 is an illustration depicting a mirror mounted to the rotatable base member configured for reflecting a beam from a first light source.

For example, a first set of mirrors 110 may be mounted to the outer surface 104 of the base member. The mirror surface of each one of the first set of mirrors 110 is positioned to generally face away from the rotation axis 102 (i.e., faces outwards). In addition, the mirror surface of each one of the first set of mirrors 110 is slightly tilted away from the rotation axis 102 by a first predetermined angle α. Such a configuration allows the first set of mirrors 110 to reflect beams from a first light source at a grazing incident to the mirror (i.e., a large incident angle with respect to the mirror surface normal direction, typically between 75° and 90°), as illustrated in FIGS. 2A and 3.

Figure 4:
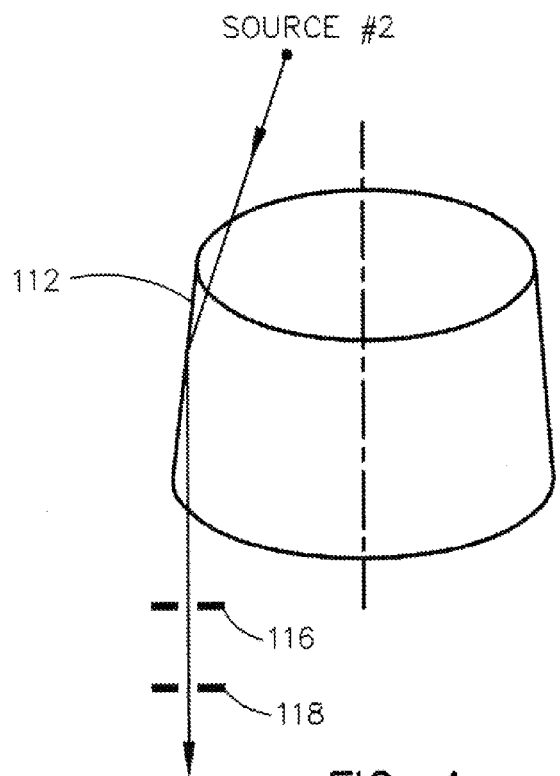
FIG. 4 is an illustration depicting another mirror mounted to the rotatable base member configured for reflecting a beam from a second light source.

A second set of mirrors 112 may be mounted to the inner surface 106 of the base member. The mirror surface of each one of the second set of mirrors 112 is positioned to generally face toward the rotation axis 102. In addition, the mirror surface of each one of the second set of mirrors 112 is slightly tilted towards the rotation axis 102 by a second predetermined angle β. Such a configuration allows the second set of mirrors 112 to reflect beams from a second light source also at a grazing incident to the mirror, as illustrated in FIGS. 2B and 4.

Figure 5:
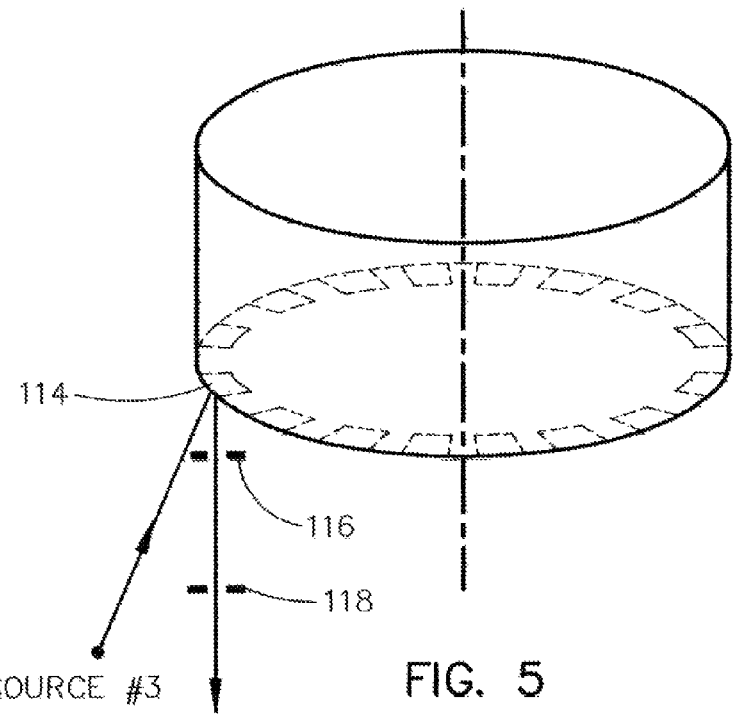
FIG. 5 is an illustration depicting another mirror mounted to the rotatable base member configured for reflecting a beam from a third light source.

Furthermore, a third set of mirrors 114 may be mounted to the end surface 108 of the base member. The mirror surface of each one of the third set of mirrors 114 is positioned so that the mirror surface is nearly perpendicular to the rotation axis 102, but slightly tilted by a third predetermined angle θ with respect to an axis perpendicular to the rotation axis 102. Such a configuration allows the third set of mirrors 114 to reflect beams from a third light source at a normal incident to the mirror (i.e., a small incident angle with respect to the mirror surface normal, typically between 0° and 20°), as illustrated in FIGS. 2 and 5.

Figure 1B:
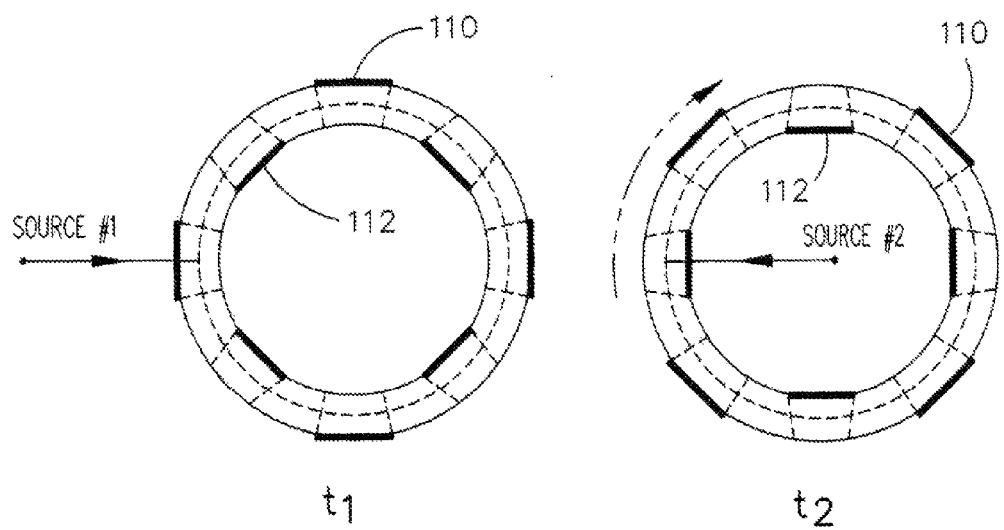
FIG. 1B is a top view of the rotatable base member of FIG. 1A.

It is noted that in order to direct the EUV beams to a common optical path, the first set of mirrors 110 and the second set of mirror 112 may be staggered as shown in FIG. 1B. That is, at time $t_1$, for example, the beam from the first light source may illuminate one of the mirrors from the first set 110 (e.g., striking the mirror at the location indicated by the intersection with the dashed line), and the beam may be reflected towards the common optical path as shown in FIG. 3. The base may continue to rotate, and at time $t_2$, the beam from the second light source may illuminate one of the mirrors from the second set 112 (e.g., striking the mirror at the location indicated by the intersection with the dashed line), and the beam may also be reflected towards the common optical path as shown in FIG. 4. Similarly, the positions of the mirrors in the third set 114 may also be staggered with respect to the first set 110 and the second set 112, allowing the EUV beams from various light sources to be directed to the common optical path.

It is contemplated that the number of mirrors included in each set is determined based on the rotation speed of the base member 100 and the pulse rate of the corresponding light source. For instance, each time the first light source emits EUV photons, one of the mirrors from the first set 110 needs to be rotated in place for reflecting the emission from the first light source. Similarly, each time the second light source emits EUV photons, one of the mirrors from the second set 112 needs to be rotated in place for reflecting the emission from the second light source. This type of synchronization also applies to the third light source and the third set of mirrors 114 as well.

It is also contemplated that additional light sources may be positioned near the first, the second or the third light source depicted in the figures. For instance, one or more additional light source may be positioned near the first light source. The additional light source may correspond to another set of mirrors mounted to the outer surface 104 of the base member similar to that of the first set of mirrors 110. This additional set of mirrors may interleave with the first set of mirrors, and this configuration allows the outer surface 104 of the base member to be utilized for reflecting EUV from multiple light sources to the common optical path. In addition, one or more additional light source may be positioned near the second light source. This additional light source may correspond to another set of mirrors mounted to the inner surface 106 of the base member similar to that of the second set of mirrors 112, allowing the inner surface 106 of the base member to be utilized for reflecting EUV from multiple light sources. Similarly, the end surface 108 of the base member may also be utilized for reflecting EUV from multiple light sources.

Therefore, the base member 100 in accordance with the present disclosure may utilize three difference surfaces to temporally multiplex EUV light sources. Since EUV light has high reflectivity only at grazing incident and near-normal incident, the different sets of mirrors described above are positioned to reflect EUV light either at grazing incident (e.g., the first and second set) or near-normal incident (e.g., the third set). By utilizing three different surfaces of the base member 100, the number of light sources that can be temporally multiplexed increases threefold in limited total system track length, and in small grazing and normal incident angle ranges where mirror reflectivity is high (e.g., R>60% for 0-20° normal incidence, and R>80% for 0-15° grazing incidence). In one configuration, eight or more different light sources may be provided from each of the three directions, effectively providing multiplexing for 24 sources or more. However, it is contemplated that the specific number of sources provided from each direction may vary without departing from the spirit and scope of the present disclosure.

Furthermore, as depicted in FIGS. 3 through 5, a field stop/aperture and a pupil stop/aperture (depicted as elements 116 and 118) may be placed after the mirrors on the optical path to improve the illumination stability. In a Kohler illumination scheme, source emission is collected by some kinds of collector (ellipsoid mirror, or Wolter-type mirror) to form an image. The image of source is designed as the entrance pupil of a condenser (for example Schwarzschild or Equal-Radii), which is used to focus light onto a mask, while maintaining good illumination telecentricity. The field stop is a conjugate of the illumination field on a mask to be inspected. The field and pupil stops determine the optical path for mask inspection. Due to source pulse length and timing jitter, movable mirror wobble and vibration, movable base velocity instability, the light centroid after each rotating mirror deviates from the target optical path.

By placing the field and pupil stops after the mirrors on the optical path in accordance with the present disclosure, only a fixed portion out of the spread light is let through, resulting into more stable illumination of the mask. In addition, the field and pupil stops may also serve the purpose of define the location, size and shape of illumination pupil and field.

While the examples above described mounting mirrors to the outer surface, the inner surface and the end surface of the base member, it is contemplated that not all three surfaces of the base member are required to have mirrors mounted thereof. That is, any one or combination of the first, second or third set of mirrors may be mounted to the base member without departing from the spirit and scope of the present disclosure. In addition, if the inner surface is not used (for mounting mirrors), the base member may be configured as a solid piece with no openings defined in the middle.

Figure 6:
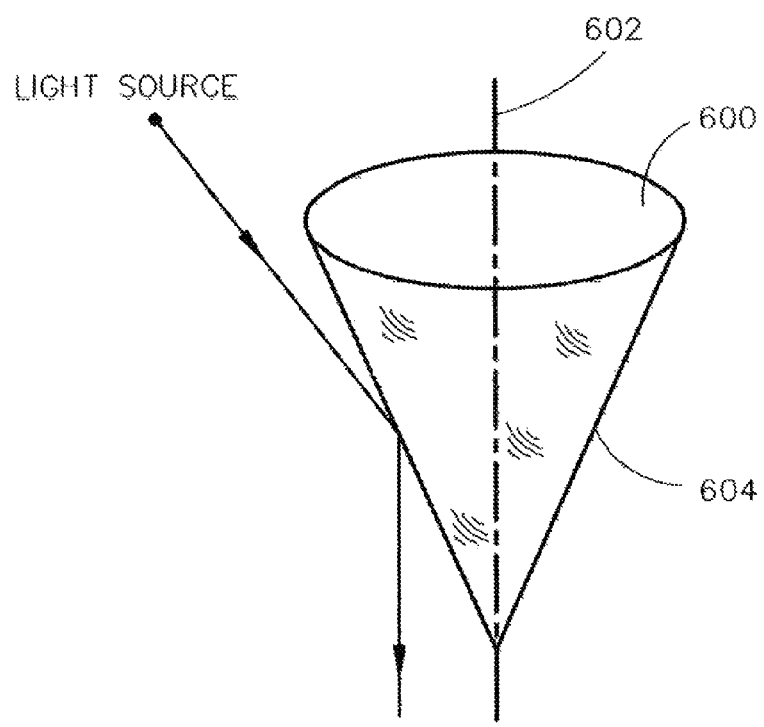
FIG. 6 is an illustration depicting a conic mirror configured for reflecting a beam from a light source according to an embodiment of the present invention.
Figure 7:
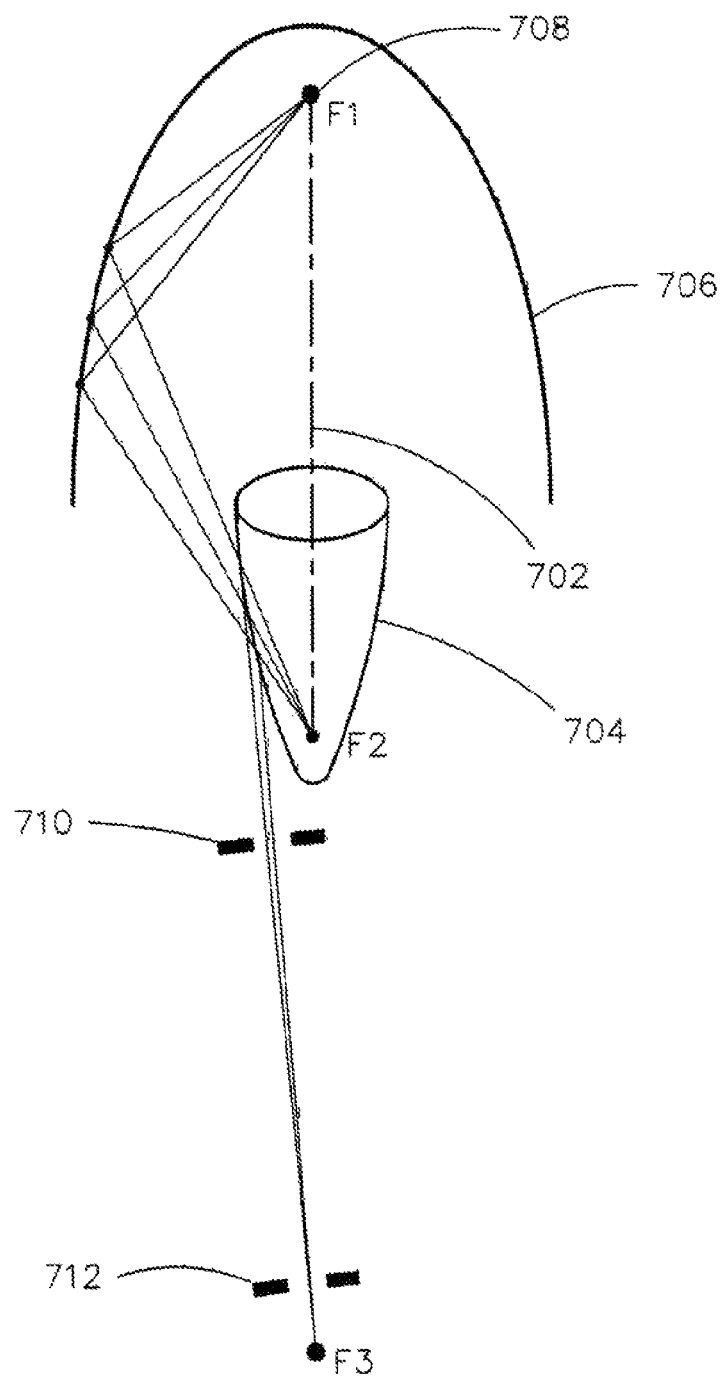
FIG. 7 is an illustration depicting another conic mirror configured for reflecting a beam from a light source.
Figure 8:
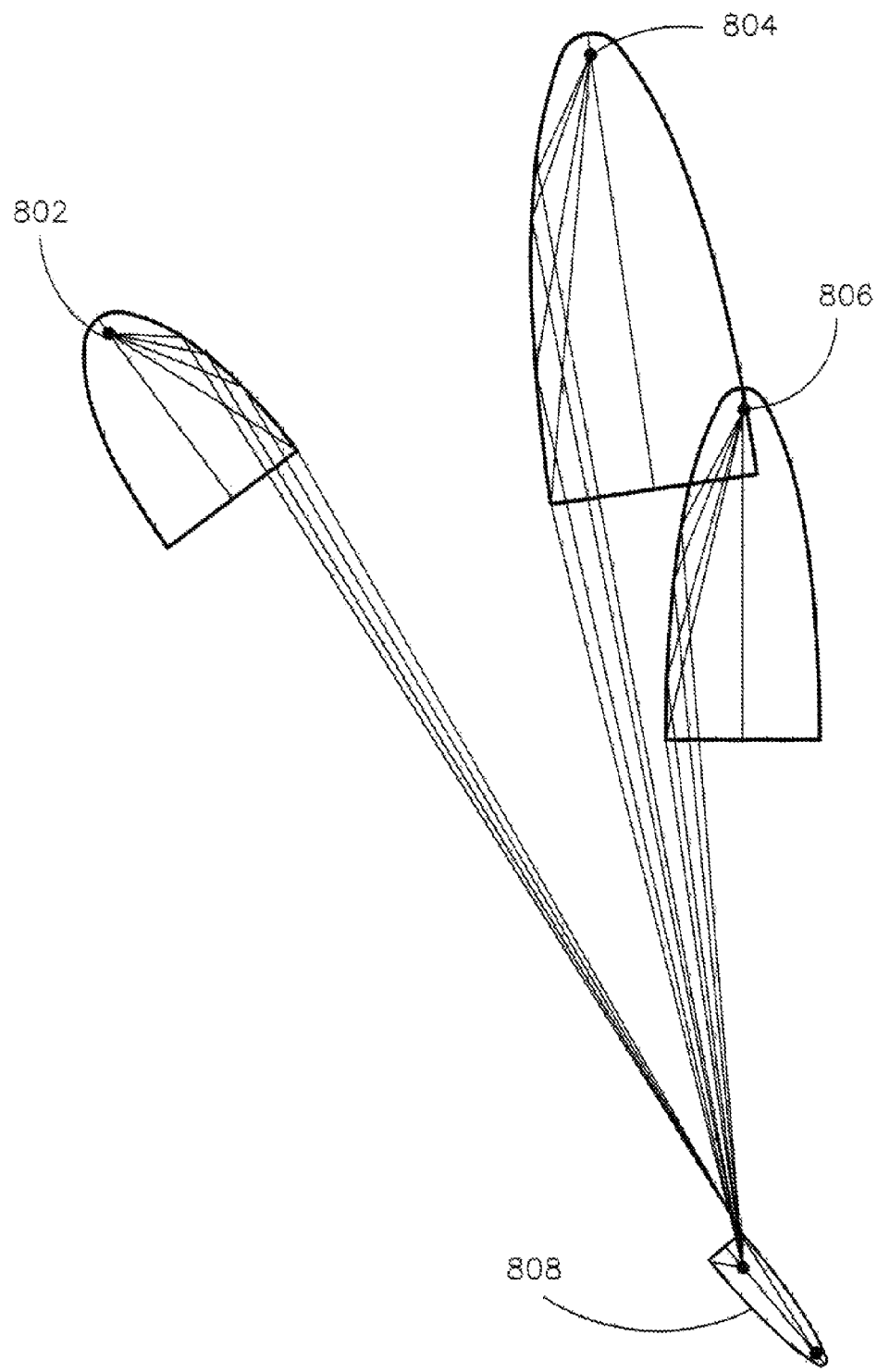
FIG. 8 is an illustration depicting a conic mirror configured for reflecting beams from multiple light sources.

Referring to FIGS. 6 through 8, another embodiment of the illumination system in accordance to the present disclosure is shown. The illumination system may also include a rotatable base member 600 rotatable about a rotation axis 602. The base member 600 also provides surfaces where mirrors may be mounted to. The mirror 604 mounted to the base member 600 may be a conic mirror with center of axis overlapping with the rotation axis 602. Utilizing a conic mirror improves beam stability compare to a planar mirror, of which the center and the edge (of the planar mirror) are at different locations relative to the rotation axis. Using a conic surface, within extended time determined by the width of the conic mirror and the rotation speed, the mirror surface that is illuminated by the light source is always at the same spatial location relative to the source, because the conic surface has rotational symmetry with respect to the rotation axis 602. Therefore, this configuration may minimize the impact of source pulse duration, time jitter and rotating base velocity instability to illumination stability.

In addition to improving the illumination stability, the conic mirror in accordance with the present disclosure may also be utilized for the purpose of assisting emission collection. For instance, as depicted in FIG. 7, a collection module 706 may be utilized to provide emission collection for the light source 708. The collection module 706 may be an ellipsoidal shaped module, a parabolic shape module or the like. If the collection module 706 is an ellipsoidal mirror that has a first focus at the source (i.e., F1 in FIG. 7), then the conic mirror 704 may be configured as a hyperbolical mirror (the physical mirror only corresponds to a portion of the hyperbola) that has one of its foci overlapping with the second focus of the ellipsoidal mirror 706 (i.e., F2 in FIG. 7), and the other one of its foci on the illumination pupil (i.e., F3 in FIG. 7). This configuration allows the collection module 706 to receive light from the light source 708 at grazing incidence and reflect the light towards the conic mirror 704 mounted on the rotatable base. The conic mirror 704 in turn receive light from the collection module 706 at grazing incidence, assists emission collection and reflect the light towards the optical path.

It is contemplated, however, that configuring the conic mirror 704 as a hyperbolical mirror is merely exemplary. The conic mirror 704 may be configured as an ellipsoidal mirror and provide similar result. For example, if the collection module 706 is a parabolic mirror that has a focus at the source, the conic mirror 704 may also be configured as a parabolic mirror with focus on the illumination pupil. In such a configuration, the inner surface of the conic mirror 704 may be utilized for reflecting the light towards the optical path. More generally, both inner and outer surfaces of the conic mirror in accordance with the present disclosure may be mounted on a rotatable base and utilized for multiplexing. Additionally, the specific shape of the conic mirror may vary based on the specific type of the light source and/or collection module utilized.

For instance, the conic mirrors referenced in the present disclosure may include conical mirrors, ellipsoidal mirrors, hyperbolical mirrors, spherical mirrors or the like. Such a conic mirror may be formed utilizing a plurality of segmented curved mirrors that correspond to the light source. The conic mirror in accordance with the present disclosure reflects light from a source (F1) to a source image (F3). By combining concentric ellipsoid and hyperboloid, the source can be imaged with small aberrations.

It is also contemplated that a field and a pupil stops (depicted as elements 710 and 712) may be placed after the conic mirror 704 on the optical path to define the light path and improve the illumination stability, as previously described. Further, any image jitter from source does not cause problem in deviating light that passes through the field and pupil stops, because each hyperboloid mirror facet is rotated to the same location when light hits the mirror at different time.

In addition, the conic mirror in accordance with the present disclosure may be utilized to reflect beams from more than one light source. For instance, as illustrated in FIG. 8, the conic mirror 808 may receive beams from light sources 802, 804 and 806 at grazing incidence and reflect the beams towards a common optical path for mask inspection. Alternatively, different conic mirrors may be utilized for different sources without departing from the spirit and scope of the present disclosure.

Figure 9:
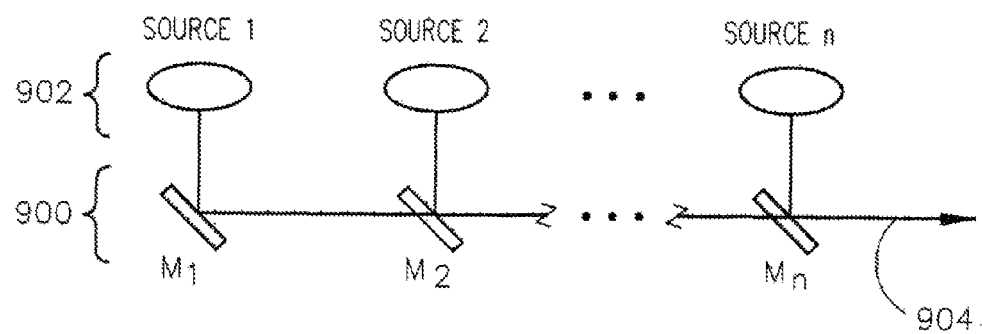
FIG. 9 is an illustration depicting an array of mirrors configured for reflecting beams from an array of light sources according to an embodiment of the present invention.

Referring to FIGS. 9 through 13, another embodiment of the illumination system in accordance to the present disclosure is shown. The illumination system may utilize an array of individually rotating mirrors 900 to multiplex the plurality of light sources 902. In accordance with the present disclosure, the mirrors 900 are placed along a common optical axis 904. The light sources 902 may be positioned on either side of this axis 904. In one configuration, as depicted in FIG. 9, the light sources 902 may all be placed on the same side of the axis 904.

The mirrors 900 may be controlled by a control mechanism and synchronized with the light pulses of their corresponding sources 902 so that when source N has emitted a pulse of light, mirror N will be in place to direct the light along the optical axis 904. That is, the oscillation frequency of each mirror would be the same as the repetition rate of its corresponding light source. In addition, the angular position of each mirror would be slightly out of phase with the others so as to achieve the multiplexing and avoid blocking the beam from other sources.

Figure 10:
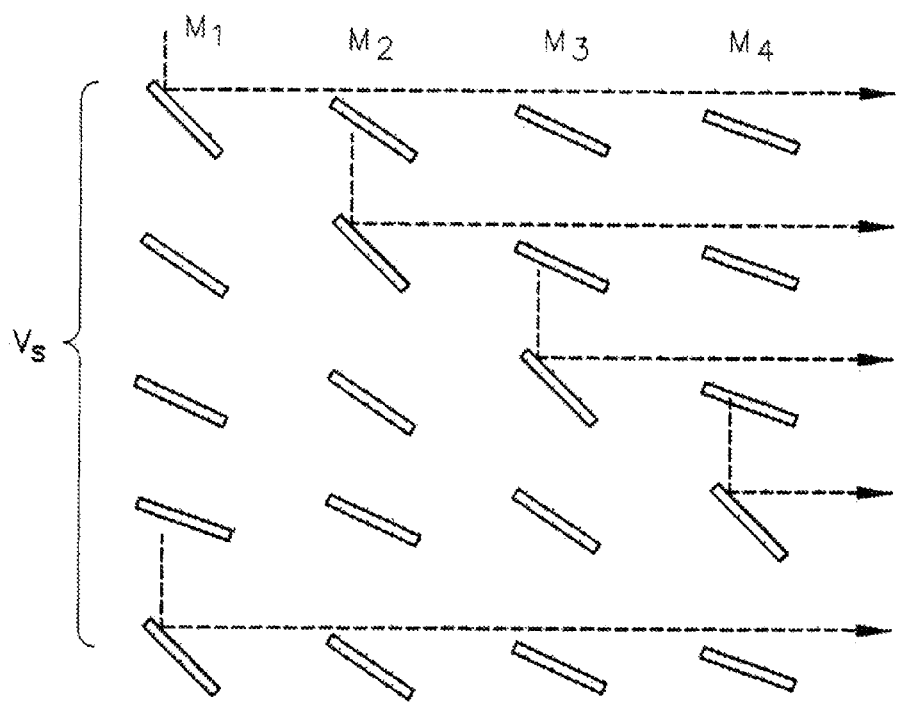
FIG. 10 is an illustration depicting the operation of the array of mirrors depicted in FIG. 9.
Figure 11:
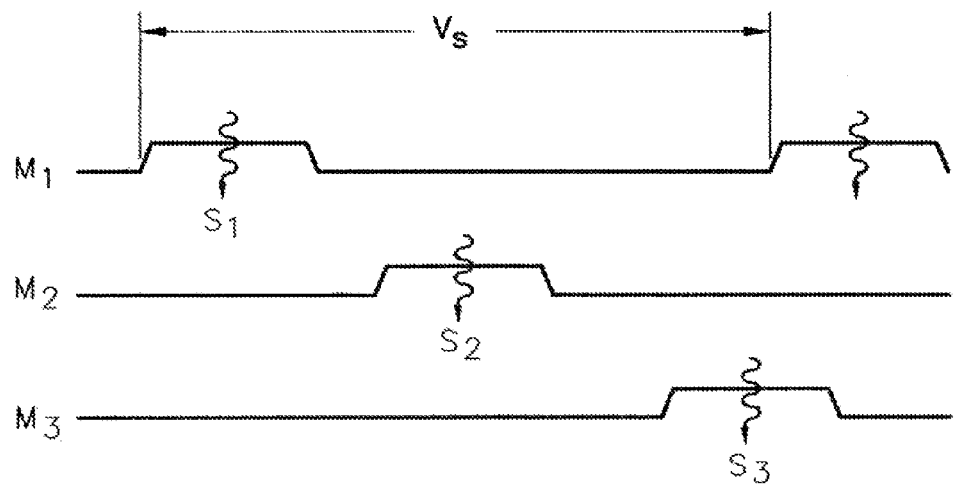
FIG. 11 is a timing diagram depicting the timing of an array of mirrors duration operation.
Figure 12:
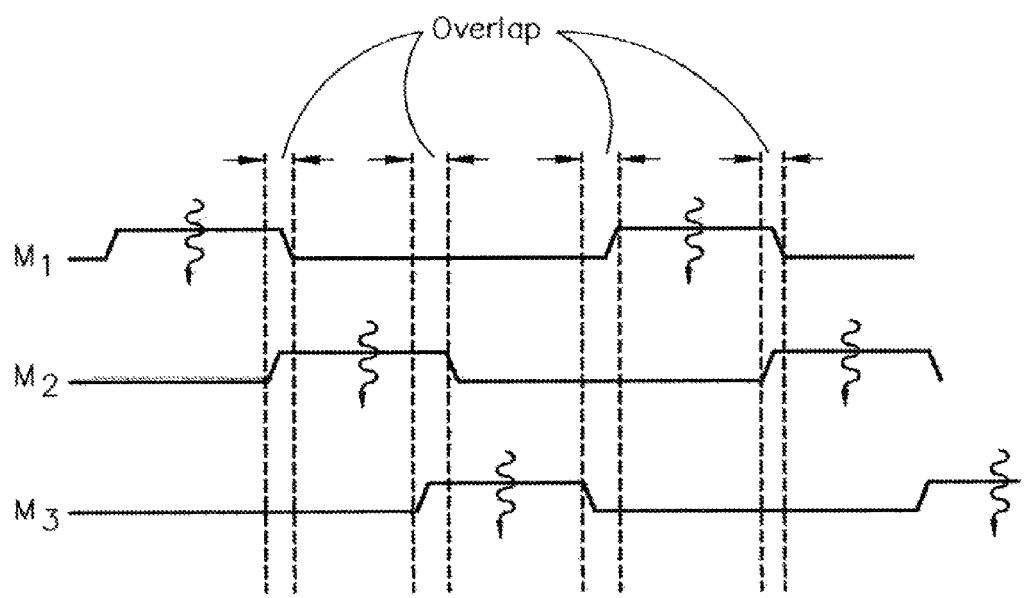
FIG. 12 is another timing diagram depicting the timing of an array of mirrors duration operation.

The synchronization between the mirrors and the light sources is illustrated in FIGS. 10 and 11, where mirror i flips/rotates into the reflecting position before its corresponding light pulse arrives. Subsequently, mirror i flips/rotates into the resting position and mirror i+1 then flips/rotates into its reflecting position. Suppose the source pulse frequency is $V_S$, the mirrors must have a fundamental oscillation frequency equal to $V_S$ and a duty cycle not equal to 1.

It is contemplated, however, that mirror i+1 does not have to wait till mirror i is fully positioned in its resting position before mirror i+1 starts to rotate into its reflecting position. Therefore, possible overlap of timing with mirrors may be allowed. That is, as long as mirror j is positions out of the way when light is passing from mirror i, where i<j, the movement of more than one mirror at a time is permitted, as illustrated in the timing diagram of FIG. 12. It is also contemplated that the duty cycle of each mirror may be configured to be no less than $$\frac{1}{\text{Number of Mirrors}}$$

(i.e., the reciprocal of the number of mirrors). In this manner, each mirror is positioned in its reflecting position for a duration long enough so that the illumination system is insensitive to beam arrival errors (e.g., duration of each pulse, source time jitter or the like).

It is also contemplated that various types of mirrors (e.g., microelectromechanical systems (MEMS) type mirrors or the like) may be utilized to implement the illumination system in accordance with the present disclosure. Furthermore, resonant mirrors or the like may also be utilized without departing from the spirit and scope of the present disclosure. FIG. 13 illustrates a timing diagram for an illumination system utilizing resonant mirrors.

In addition to temporal multiplexing, the various embodiments described in the present disclosure may also be configured for providing spatial multiplexing. For example, more than one of the illumination systems described above may be utilized together to deliver EUV photons to the same location. Simultaneously multiplexing both temporally and spatially improves both brightness and illumination uniformity. For instance, the illumination field intensity from DPP sources has large field non-uniformity (~50%) that may not be favorable for mask inspection. However, when spatially separating light from source, the peak intensity on illumination field can be shifted, thus improve the field uniformity.

Additionally and/or alternatively, more than one of the illumination systems described above may be utilized in a cascade manner to deliver EUV photons to the same location. That is, the output of one of the illumination systems may be utilized as the input/source for another illumination system. Such a cascade configuration also improves both brightness and illumination uniformity.

The various embodiments described in the present disclosure may be utilized for mask inspections as they are capable to resolve features and defects below the 22 nm node. More specifically, the illumination systems in accordance with the present disclosure enable EUV sources of small brightness to be used for EUV mask defect inspection at nodes below the 22 nm (e.g., at the 16 nm and 11 nm nodes). A few types of relatively cheap and commercially available DPP sources or low-end LPP sources may be utilized as the light sources, therefore reducing the cost of the overall illumination system. Utilizing the multiple plane or conic mirrors that are either attached to a continuously rotating base with different angles or individually rotating to position for each pulse, the reflected beams may be directed through the same optical path (defined by a field stop and a pupil stop) as described above. The light may then be focused by a condenser to an EUV mask. The reflected and scattered light from the mask may then be imaged by some imaging optics (not shown in the figures) onto some sensors. The mask image may be subsequently processed for defect information.

The various embodiments described in the present disclosure provide several advantages over existing methods.

For instance, the illumination systems in accordance with the present disclosure increases the temporally multiplexed light sources several-fold within limited track length, at grazing and normal incident angles (in which mirror reflectivity is high). The beam stability is also improved by the setup of stops and conic mirrors. In addition, the illumination systems in accordance with the present disclosure are most suitable for mask inspection, whereas existing methods are provided for lithography. It is noted that EUV mask inspection and EUV lithography have different requirements for illumination stability, telecentricity and field uniformity.

It is contemplated that the illumination systems in accordance with the present disclosure may also be utilized for other pulsed light sources in addition to EUV DPP or LPP sources. Other light sources may include, but are not limited to, infrared to ultraviolet laser, ultraviolet arc lamp, laser-enhanced ultraviolet plasma light source or the like.

The methods disclosed may be implemented as sets of instructions, through a single production device, and/or through multiple production devices. Further, it is understood that the specific order or hierarchy of steps in the methods disclosed are examples of exemplary approaches. Based upon design preferences, it is understood that the specific order or hierarchy of steps in the method can be rearranged while remaining within the scope and spirit of the disclosure. The accompanying method claims present elements of the various steps in a sample order, and are not necessarily meant to be limited to the specific order or hierarchy presented.

It is believed that the system and method of the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory.

What is claimed is:

1. An illumination system, comprising:
   a base member rotatable about a rotation axis, the base member having a generally truncated conical shape defining at least an outer surface, an inner surface and an end surface;
   at least two of:
   a first set of mirrors distributed around the outer surface of the base member, each one of the first set of mirrors having a mirror surface generally facing away from the rotation axis and tilted away from the rotation axis by a first predetermined angle;
   a second set of mirrors distributed around the inner surface of the base member, each one of the second set of mirrors having a mirror surface generally facing toward the rotation axis and tilted toward the rotation axis by a second predetermined angle; and
   a third set of mirrors distributed around the end surface of the base member, each one of the third set of mirrors having a mirror surface tilted by a third predetermined angle with respect to an axis perpendicular to the rotation axis;
   wherein the first set of mirrors, the second set of mirrors and the third set of mirrors are configured for reflecting radiations from a plurality of illumination sources and merging the radiations from the plurality of illumination sources so that the radiations are directed to traverse along a common optical path.

2. The illumination system of claim 1, wherein the illumination system comprises the first set of mirrors, the second set of mirrors, and the third set of mirrors.

3. The illumination system of claim 1, wherein at least one of the first set of mirrors or the second set of mirrors is configured for reflecting radiations from a corresponding illumination source at grazing incidence.

4. The illumination system of claim 1, wherein the third set of mirrors is configured for reflecting radiations from a corresponding illumination source at near-normal incidence.

5. The illumination system of claim 1, wherein each of the plurality of illumination sources is a pulsed EUV source.

6. The illumination system of claim 1, further comprising:
   at least one aperture positioned on the common optical path.

7. The illumination system of claim 1, further comprising:
   an additional set of mirrors mounted to the outer surface of the base member, the additional set of mirrors positioned to be interleaved with the first set of mirrors, each one of the additional set of mirrors having a mirror surface generally facing away from the rotation axis and tilted away from the rotation axis by a predetermined angle different from the first predetermined angle, wherein the additional set of mirrors is configured for reflecting radiations from an illumination source to the common optical path.

8. The illumination system of claim 1, further comprising:
   an additional set of mirrors mounted to the inner surface of the base member, the additional set of mirrors positioned to be interleaved with the second set of mirrors, each one of the additional set of mirrors having a mirror surface generally facing toward the rotation axis and tilted toward the rotation axis by a predetermined angle different from the second predetermined angle, wherein the additional set of mirrors is configured for reflecting radiations from an illumination source to the common optical path.

9. The illumination system of claim 1, further comprising:
   an additional set of mirrors mounted to the end surface of the base member, the additional set of mirrors positioned to be interleaved with the third set of mirrors, each one of the additional set of mirrors having a mirror surface tilted by a predetermined angle with respect to the axis perpendicular to the rotation axis, wherein the predetermined angle is different from the third predetermined angle, and wherein the additional set of mirrors is configured for reflecting radiations from an illumination source to the common optical path.

10. An illumination system, comprising:
    a plurality of illumination sources, wherein the illumination sources include collection modules configured for providing emission collection for the illumination sources;
    a base member rotatable about a rotation axis; and
    a conic mirror positioned on an outer surface of the base member, wherein a center of axis of the conic mirror is configured to coincide with the rotation axis, wherein the base member is configured to support rotation of the conic mirror about the rotation axis independently with respect to the plurality of illumination sources, and wherein the conic mirror is configured to receive light from the plurality of illumination sources at grazing incidence angles between approximately 0° and 15° with respect to a surface of the conic mirror and reflect the light from the plurality of illumination sources to traverse along a common optical path.

11. The illumination system of claim 10, wherein at least one of the collection modules is an ellipsoidal shaped module and the conic mirror is at least one of: a hyperbolical mirror or an ellipsoidal mirror.

12. The illumination system of claim 10, wherein at least one of the collection modules is a parabolic shaped module and the conic mirror is a parabolic mirror.

13. The illumination system of claim 10, wherein the plurality of illumination sources includes a pulsed EUV source.

14. The illumination system of claim 10, further comprising: at least one aperture positioned on the common optical path.

15. An illumination system, comprising:
   an array of individually rotatable mirrors placed in a single file along a common optical axis;
   an array of light sources corresponding to the array of individually rotatable mirrors; and
   a control mechanism in communication with the array of individually rotatable mirrors, the control mechanism configured for rotating the array of individually rotatable mirrors into reflecting positions for the corresponding array of light sources wherein the array of individually rotatable mirrors are configured to direct light emitted by the array of light sources to traverse along the common optical axis,
   wherein the array of light sources include an array of pulsed light sources, and
   wherein each particular individual mirror of the array of individually rotatable mirrors has an oscillation frequency the same as the pulse rate of its corresponding light source.

16. The illumination system of claim 15, wherein each particular individual mirror of the array of individually rotatable mirrors has a duty cycle no less than a reciprocal of the number of mirrors in the array.

17. The illumination system of claim 15, wherein each particular individual mirror of the array of individually rotatable mirrors includes at least one of: a MEMS type mirror or a resonant mirror.

* * * * *